US007024345B1

United States Patent
Stamm et al.

(10) Patent No.: US 7,024,345 B1
(45) Date of Patent: Apr. 4, 2006

(54) SYSTEM AND METHOD FOR TESTING PARAMETERIZED LOGIC CORES

(75) Inventors: Reto Stamm, County Tipperary (IE);
Mary O'Connor, Dublin (IE);
Christophe Brotelande, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/360,472

(22) Filed: Jul. 23, 1999

(51) Int. Cl.
*G06F 17/50* (2006.01)

(52) U.S. Cl. .......................... 703/14; 703/20; 714/739; 706/13

(58) Field of Classification Search ............... 703/14, 703/16, 17, 2, 20, 13; 714/738, 739; 716/4
See application file for complete search history.

(56) References Cited

U.S. PATENT DOCUMENTS 5,910,897 A * 6/1999 Dangelo et al. ............ 364/488
5,910,898 A * 6/1999 Johannsen .................. 354/489
5,963,454 A * 10/1999 Dockser et al. ............. 364/488
6,120,549 A * 9/2000 Goslin et al. ................. 703/20
6,212,667 B1 * 4/2001 Geer et al. ..................... 716/6
6,243,851 B1 * 6/2001 Hwang et al. ................ 716/10
6,292,925 B1 * 9/2001 Dellinger et al. .............. 716/8
6,463,560 B1 * 10/2002 Bhawmik et al. ........... 714/733
6,530,054 B1 * 3/2003 Hollander ................... 714/739
6,553,531 B1 * 4/2003 Kim et al. .................. 714/739

* cited by examiner

*Primary Examiner*—Thai Phan
(74) *Attorney, Agent, or Firm*—LeRoy D. Maunu

(57) ABSTRACT

A system and method for testing a parameterizable logic core are provided in various embodiments. A test controller is configured and arranged to generate a set of random parameter values for the logic core. A netlist is created from the parameterized logic core, and circuit behavior is simulated using the netlist. In other embodiments, selected parameter values are optionally weighted to increase the probability of generating those values, and the parameter set is cloned and mutated when simulation fails.

17 Claims, 7 Drawing Sheets

SYSTEM AND METHOD FOR TESTING PARAMETERIZED LOGIC CORES

FIELD OF THE INVENTION

The present invention generally relates to testing parameterized logic cores, and more particularly to improving test coverage of parameterized logic cores.

BACKGROUND

Logic cores are becoming increasingly popular in the design of integrated circuits. Whereas in the past, integrated circuits were largely designed from scratch, today's integrated circuits are designed using pre-designed logic elements that are made available in logic cores. One reason for the popularity of logic cores is the trend toward standards-based implementations. Additional reasons includes desires to speed the design process and reduce costs.

Parameterized logic cores permit a designer to partially customize predefined logic circuits. For example, a synchronous FIFO element of a logic core may include port-width and depth parameters which allow the designer to tailor the logic to satisfy application-specific requirements.

Designers who use logic cores rely on the fact that the elements operate correctly, both individually and when connected to other logic elements. Thus, logic core vendors must sufficiently test the logic, not only to verify that the circuit performs the specified function for commonly used parameters, but also to verify that circuit operates satisfactorily for infrequently used parameters.

While testing individual elements of a logic core using various permutations of the available parameters may be feasible, the number of permutations of parameters when considering various combinations of the logic elements in the core quickly escalates. Thus, there may be more permutations or parameters for a logic core than can feasibly be tested.

Testers often resort to constructing test sets that reflect a representative set of possible parameter permutations. While this approach can be tailored to fit the time available for testing, the associated risk is that some errors may go undetected. To increase test coverage more resources must be devoted to testing.

A method that address the aforementioned problems, as well as other related problems, is therefore desirable.

SUMMARY OF THE INVENTION

In various embodiments, the invention provides a computer-implemented method and system for testing a parameterizable logic core. A set of parameter values for the logic core is randomly generated. Using the random parameter values, a netlist is generated, and circuit behavior is simulated.

In one embodiment, the random parameter values are provided as input to a graphical user interface (GUI) of a core generator. The capability of the GUI to respond to erroneous parameter sets is thereby tested.

In another embodiment, if simulation of circuit behavior in association with a particular parameter set results in an error, the parameter set is cloned and mutated to generate a netlist for another simulation. Cloning and mutating the parameter sets can assist in replicating error conditions.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Various aspects and advantages of the invention will become apparent upon review of the following detailed description and upon reference to the drawings in which.

Figure 1:
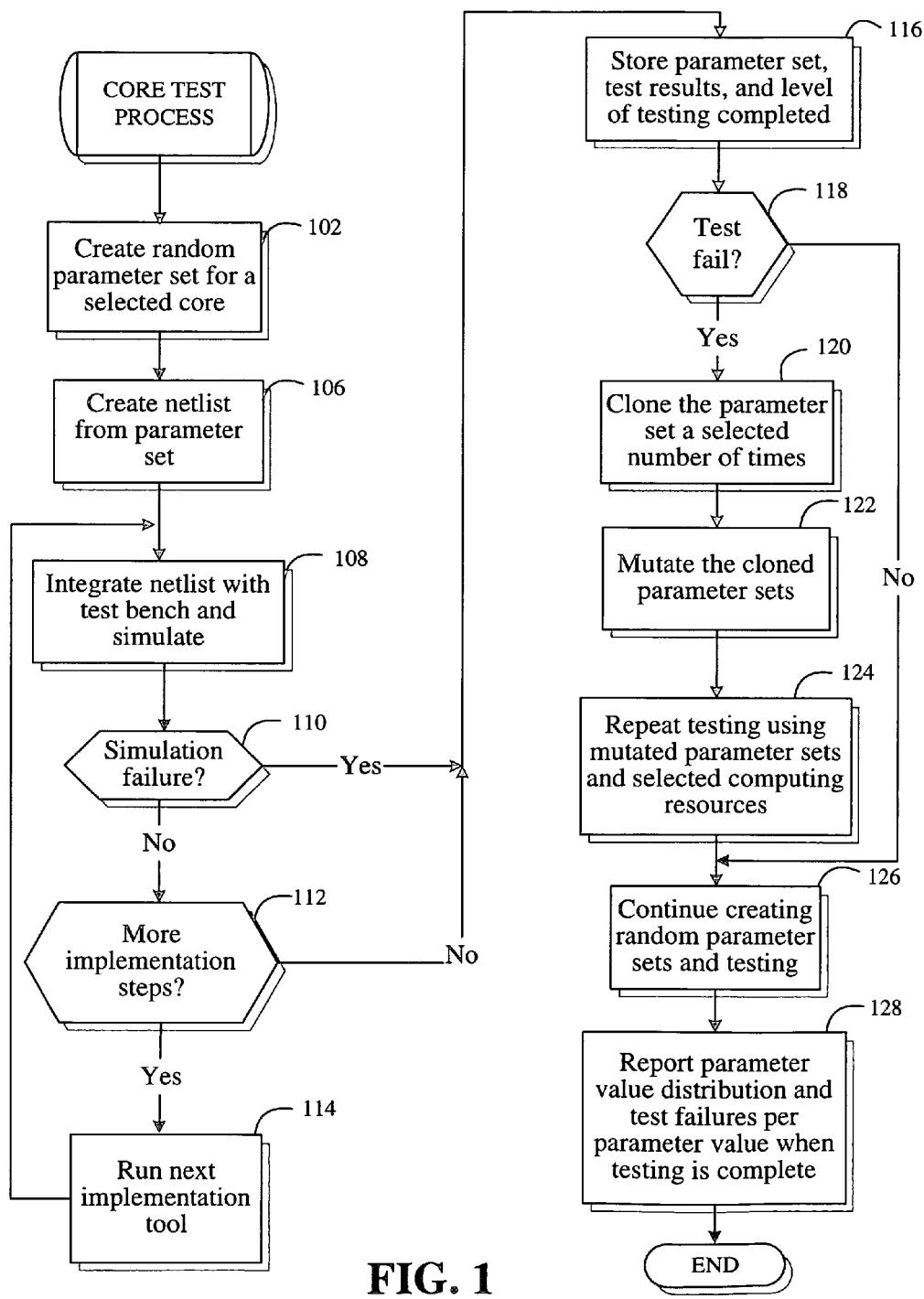
FIG. 1 is a flowchart of a process for testing parameterized logic cores in accordance with an example embodiment of the invention.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION

The present invention is believed to be applicable to a variety of methods and systems for testing parameterizable logic cores. The present invention has been found to be particularly applicable and beneficial in testing parameterizable logic cores for PLDs. While the present invention is not so limited, an appreciation of the present invention is presented by way of specific examples involving PLDs.

FIG. 1 is a flowchart of a process for testing parameterized logic cores in accordance with an example embodiment of the invention. The process generally comprises creating a random set of parameters for the logic core, testing the parameterized logic core, saving test information for further analysis, and creating further sets of random parameters for additional testing. The process of automatically, randomly creating parameter sets is believed to provide enhanced coverage relative to all possible parameter permutations. In addition, evolving parameter sets in which core testing failed is designed to help isolate errors in the core.

Figure 4:
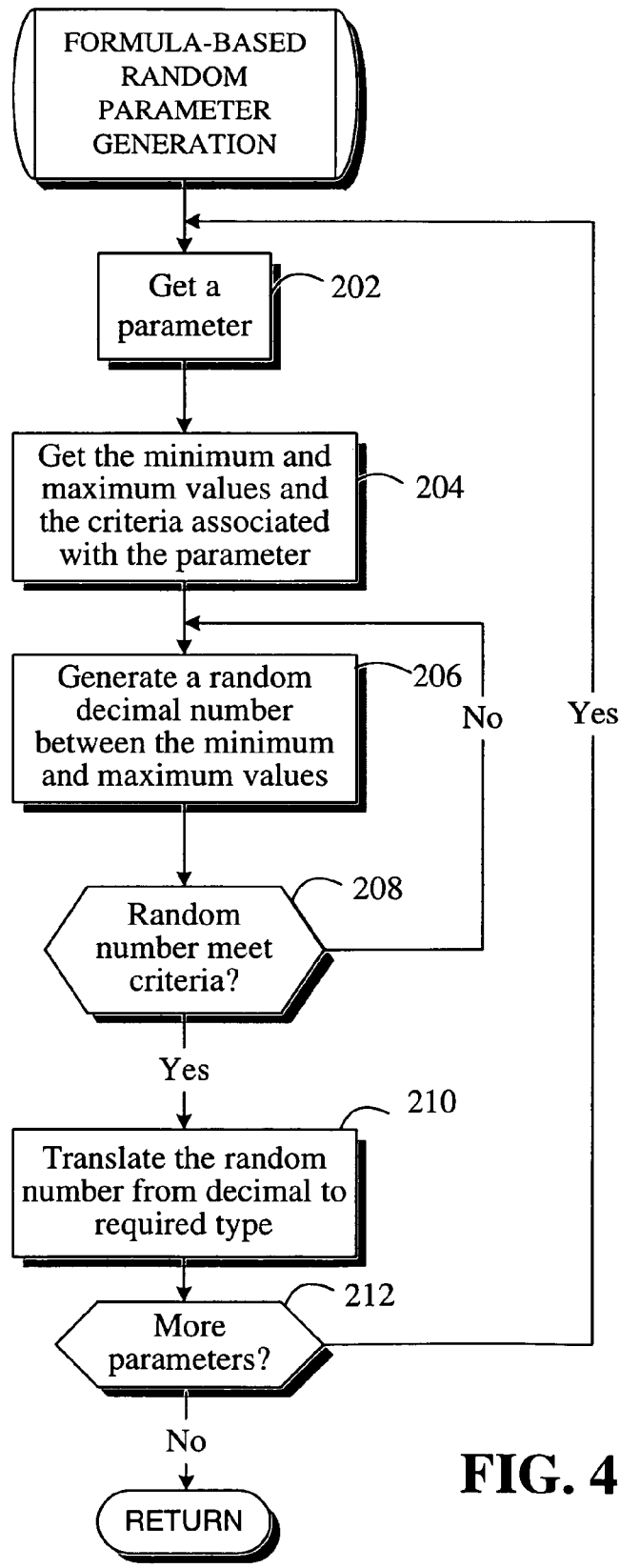
FIG. 4 is a flowchart of a process for randomly generating parameters using an example formula-based approach.
Figure 5:
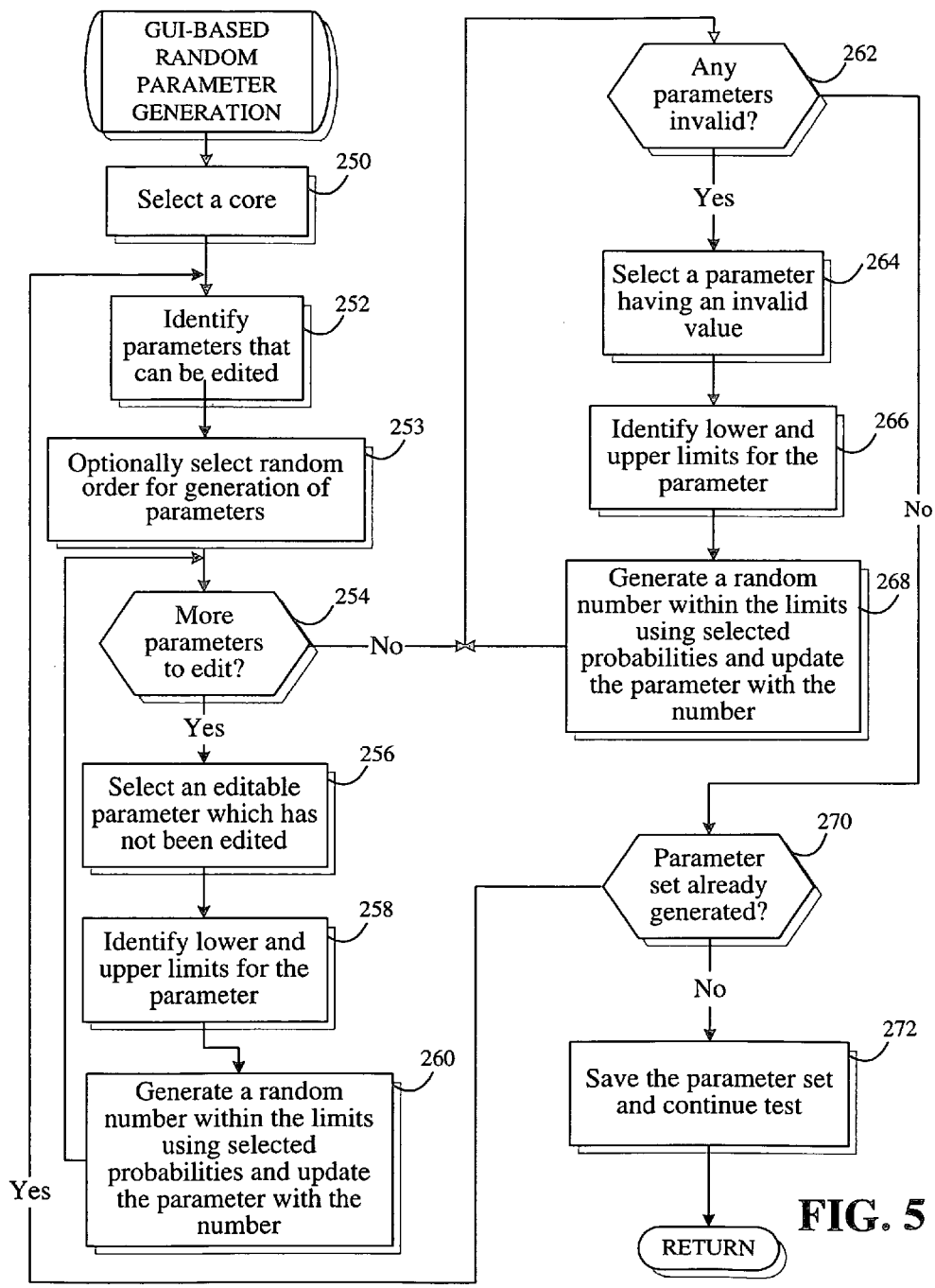
FIG. 5 is a flowchart of a process for randomly generating parameters in a GUI-based system.

At step 102 a set of random parameters is created. The set of parameters may be provided either directly to core generator software or as input to a GUI interface to a core generator. FIG. 4 illustrates a script-based process for generating random parameters, and FIG. 5 illustrates a GUI-based process for generating random parameters. In either instance, either the core generator itself or the GUI must check for parameter values that are beyond permitted limits.

The random parameter set is created using conventional methods for generating random numbers. The upper and lower limits used in generating the random numbers can be, for example, reasonable levels beyond what is permitted for the core (to test the core generator's or GUI's handling of invalid parameters).

In another embodiment, the random parameters are generated using selected, respective probabilities to weight the generation of random parameters. Thus, a parameter value having a greater weight would be more likely to be generated than would a parameter value having a lower weight. The probabilities may be assigned in two ways, for example. The first method for assigning probabilities is to specify specific parameter values as having higher probabilities. For example, if a parameter has a range of values from 1 to 8, it may be desirable to run more tests using parameter values of 1 and 8 than tests where the parameter value is out of range.

The second method assigns probabilities based on past test performance. For example, if a parameterized logic core fails a test, then the parameter values used in generating the logic core are assigned increased probabilities. Thus, subsequent tests may exhibit a tendency toward emphasizing parameter values causing tests to fail. This permits faster recognition of particular parameter values that cause the test to fail.

An assigned probability may be strictly associated with a discrete value. For example, the probability 0.75 may be associated with the parameter value 16. Alternatively, a probability may be applied to a selected value and to values near the selected value. For example, a selected parameter value 24 may be assigned a probability 0.40, parameter values 23 and 25 assigned parameter values 0.20, and the remaining parameter values having equal probabilities.

At step 106, a netlist is created from the selected core and random parameter set. Various core generator tools are available for such purpose. For example, the Xilinx CORE Generator™ System can be used to generate a netlist for XILINX programmable logic devices. It will be appreciated that other device-specific tools are available from other vendors.

At step 108 using conventional methods, the netlist is integrated with a test bench, and behavior of the parameterized logic core is simulated using conventional simulation tools. If no errors are detected in the simulation, decision step 110 directs control to decision step 112. If there are further implementation steps, for example, mapping to a particular FPGA device or place-and-route, then control is directed to step 114 to run the next implementation tool on the design. The process of steps 108–114 is repeated until there is a simulation failure or there are no more implementation steps to perform.

At step 116, the parameter set, the test results (e.g., pass or fail), and the level of testing completed are stored for future reference. Stored in addition are version levels of core generator software and devices on which the cores were simulated. The information is collected in a relational database system, for example a database system from Oracle, which is useful for analyzing results of thousands of tests.

If a test fails, decision step 118 directs control to step 120, where the parameter set is cloned a selected number of times. The number of clones may be, for example, a function of the number of possible permutations, the number of tests already performed on the core, the number of generations parameter sets already cloned for the core, and associated factors used to scale the other variables.

Each of the cloned parameter sets is then mutated at step 122. In an example embodiment, the number of parameters to mutate decreases with the number of generations of parameter sets tested, and the particular parameters that are mutated are randomly selected, for example. The number of generations of parameter sets tested depends on the time available for testing and the number of parameters.

At step 124, the processing set forth in steps 106–122 is repeated for each of the mutated parameter sets. It will be appreciated that, while not shown, a parameter set that is invalid need not be used in testing the core.

The process continues at step 126, where steps 102–124 are repeated, beginning with a random parameter set that is newly created at step 102. The number of iterations may depend on a variety of factors, such as the number of parameters, the time available, and the number failed tests. It will be appreciated that a large number of failures indicates that running additional tests may be a waste of resources, while no failures indicates that additional tests may be useful in uncovering errors.

When testing is complete, step 128 reports parameter value distribution and test failures per parameter value. For example, for parameters A, B, and C, the report may include the following information:

A: 2(4) [2] 3(8) 4(1) [1] 6(3)

B: true (13) false (3)[3]

C: Octal (8) [1] Hexadecimal (4) [1] Decimal (4) [1]

The example format for the report is a list for each parameter. Each list includes the tested parameter values and associated numbers of tests and test failures. The number in parentheses is the total number of tests performed for that parameter value, and the number in square brackets indicated the number of tests failed for the parameter value. For example, parameter A was assigned a value of 2 for a total of 4 tests, and two of the tests failed; parameter A was assigned a value of 3 for 8 tests, and all 8 tests passed; and parameter A was assigned a value of 4 for 1 of the tests and the one test failed.

Selected parameter values are highlighted to assist in debugging the tested core. For example, if every test fails when a parameter has a certain value, then this information may be helpful in isolating a problem in the core. Therefore, the example parameter report highlights a parameter value where every test fails when the parameter has that value. In the example report above, the value 4 for parameter A and the value "false" for parameter B is highlighted.

Figure 2:
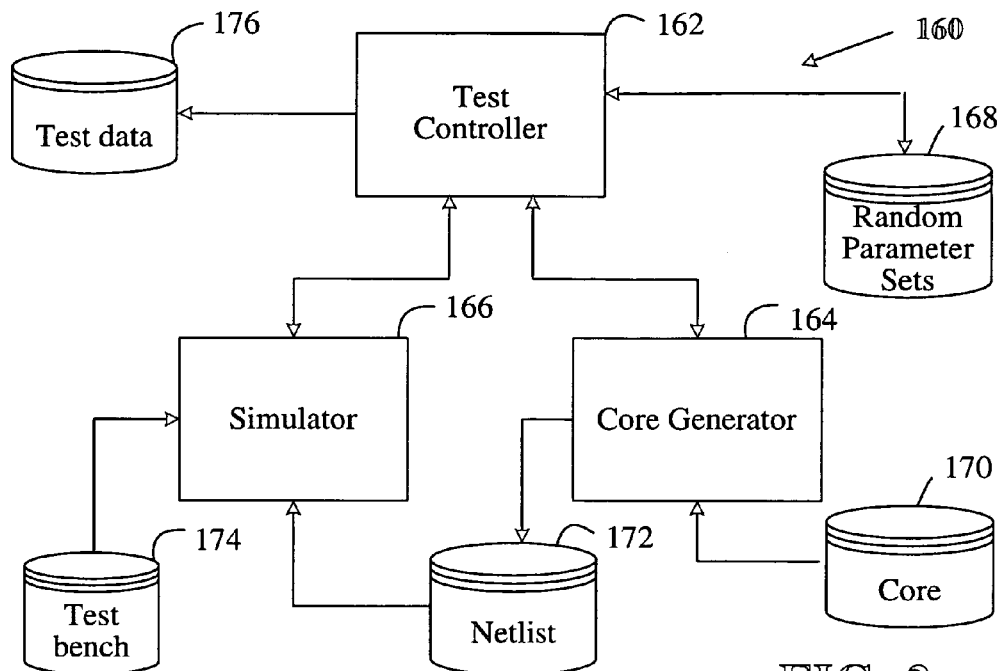
FIG. 2 is a block diagram of a first example system for testing parameterized logic cores.

FIG. 2 is a block diagram of a first example system 160 for testing parameterized logic cores. System 160 includes test controller 162, core generator 164, and simulator 166. Test controller 162, core generator 164, and simulator 166 are all software tools operable on various data processing systems running various versions of Unix and Windows operating systems, for example.

In one embodiment, test controller 162 is a script that interfaces with both core generator 164 and simulator 166. Random parameter sets 168 are created by test controller 162 in accordance with the methods described in FIG. 1.

Responsive to test controller 162, core generator 164 reads a random parameter set and a selected logic core 170, and generates netlist 172. An example core generator is the CORE Generator software system from XILINX. Netlist 172 is then combined with test bench 174 by simulator 166. Example tools that are suitable for simulator 166 include VHDL and VERILOG simulators. Those skilled in the art will recognize other suitable core generators and simulators that could be used in various embodiments of the invention.

Test controller 162 receives test result data from simulator 166 and stores test data 176. Test data 176 includes, for example, whether the test passed or failed, the parameters set, and various other information as described above. Test data 176 is stored on a test-by-test basis to enable subsequent test analysis based on various parameter values.

Figure 3:
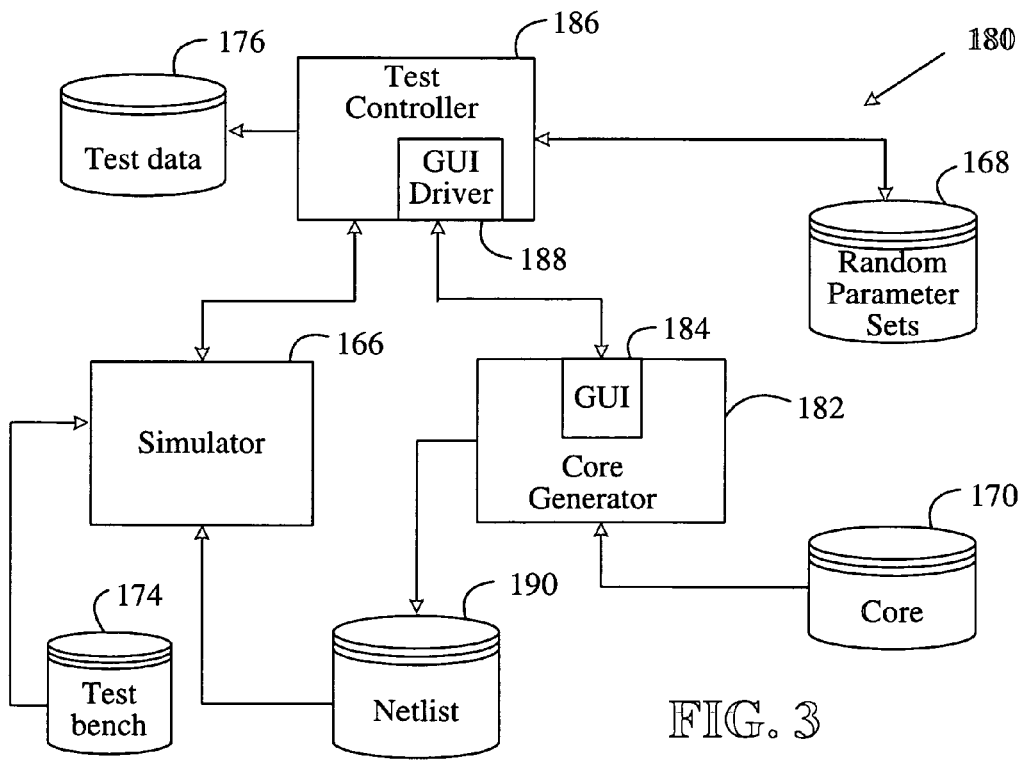
FIG. 3 is a block diagram of a second example system for testing parameterized logic cores.

FIG. 3 is a block diagram of a second example system 180 for testing parameterized logic cores. System 180 includes core generator 182 having a conventional graphical user interface (GUI) 184, and test controller 186 that has GUI driver 188. GUI 184 allows a user to select a particular core 170, enter parameters, and generate netlist 190. In a testing core generator 182 and GUI 184, inputs to and outputs from GUI 184 are processed by GUI driver 188. Various tools such as JavaStar from SunTest or WinRunner from Mercury, are available for building drivers to interact with a GUI.

Based on parameters indicated by GUI 184 as being available for editing, test controller 186 generates random parameter set 168 and provides the parameters as input to GUI 184. Programming errors in GUI 184 may be detected by test controller 186 where GUI 184 is expected to detect certain input values as errors and does not provide an error indicator as output to GUI driver 188. Thus, test controller 186 can be programmed to test a core 170, core generator 182, and GUI 184.

FIG. 4 is a flowchart of a process for randomly generating parameters using an example formula-based approach. The formula-based approach may be used, for example, in system 160 of FIG. 2. The example process generally entails using minimum and maximum values and criteria that are associated with the respective parameters and generating random parameter values that fall within the specified range and meet the specified criteria. The process is said to be "formula-based" because the criteria are generally stated in terms of a Boolean expression.

At step 202, a parameter is obtained for the parameterized core, and at step 204, the minimum and maximum values and the criteria associated with the parameter are obtained. In an example embodiment, the minimum and maximum values and associated criteria are stored in a data file.

A random number within the specified limits is generated using conventional methods at step 206. If the number does not meet the specified criteria, then decision step 208 returns control to step 206. An example specification of criteria for a parameter set having two parameters, A and B, could be, "B<A." Thus, if B is the parameter in process and the parameter value for A has already been created, then the random number generated for B must be less than the parameter value for A.

At step 210, the random number is translated from a decimal number to the format, for example, hexadecimal or binary, required by the core generator tool. Decision step 212 returns control to step 202 as long as there are more parameters to process. Otherwise, control is returned to the process for testing the parameter set (FIG. 1, 102).

FIG. 5 is a flowchart of a process for randomly generating parameters in a GUI-based system 180 (FIG. 3), for example. The process generally entails generating a random value for each editable parameter in a selected core until a valid parameter set is generated.

At step 250 a selected core is opened for processing. For example, GUI driver 188 indicates to GUI 184 which core to open. The editable parameters are identified at step 252, and a random order in which the parameters are generated and input to the GUI is selected at step 253. A random sequence in which parameters are entered supports testing behavior of the GUI. For example, if values of various ones of the parameters are dependent on one another, and the GUI is programmed to check for legal combinations, then the GUI should detect invalid parameter combinations for any order in which the values are entered.

Until there are no more parameters to edit, decision step 254 directs control to step 256.

At step 256, a parameter that has not yet been edited is selected, and the lower and upper limits of the parameter are identified at step 258. The lower and upper limits are indicated in interface data provided by GUI 184 to GUI driver 188. At step 260, a random number is generated using the identified limits and selected probabilities. The selected probabilities are those discussed with reference to FIG. 1. Control is returned to decision step 254 after the parameter is updated with the random value.

Decision step 254 directs control to step 262 after all the parameters have been updated with random values. If any of the parameters have invalid values, decision step 262 directs control to step 264 where an invalid parameter is selected. Steps 266 and 268 repeat the processing of steps 258 and 260, respectively, in generating a new random value for the parameter having the invalid value.

Once all the parameters have valid values, decision step 262 directs control to decision step 270, where the entire set is compared to parameter sets previously generated. If the new parameter set is a duplicate, it is discarded, and control is directed to step 252 to create a new random parameter set. Otherwise, the parameter set is saved at step 272, and control is returned to continue the test process.

Figure 6A:
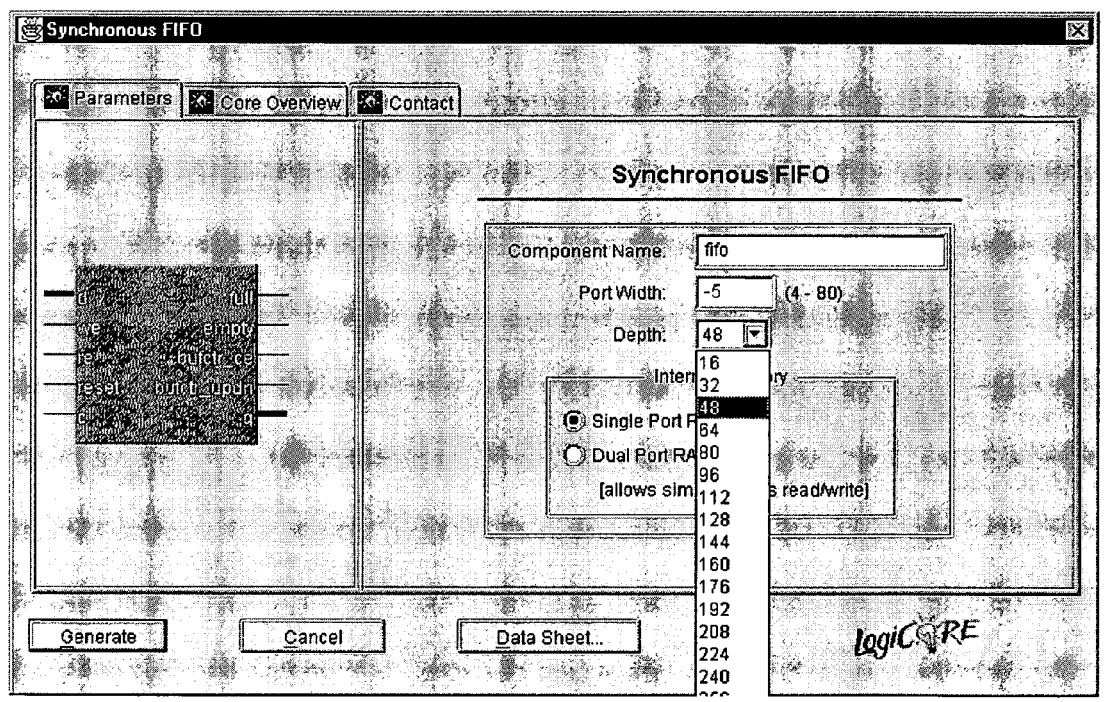
FIGS. 6A, 6B, and 6C show example GUI screens to which random parameters are input and then displayed.
Figure 6B:
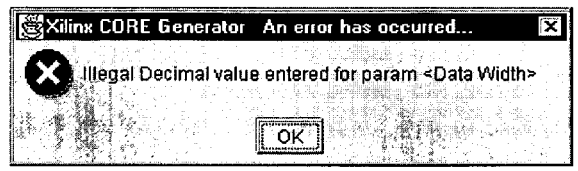
Figure 6C:
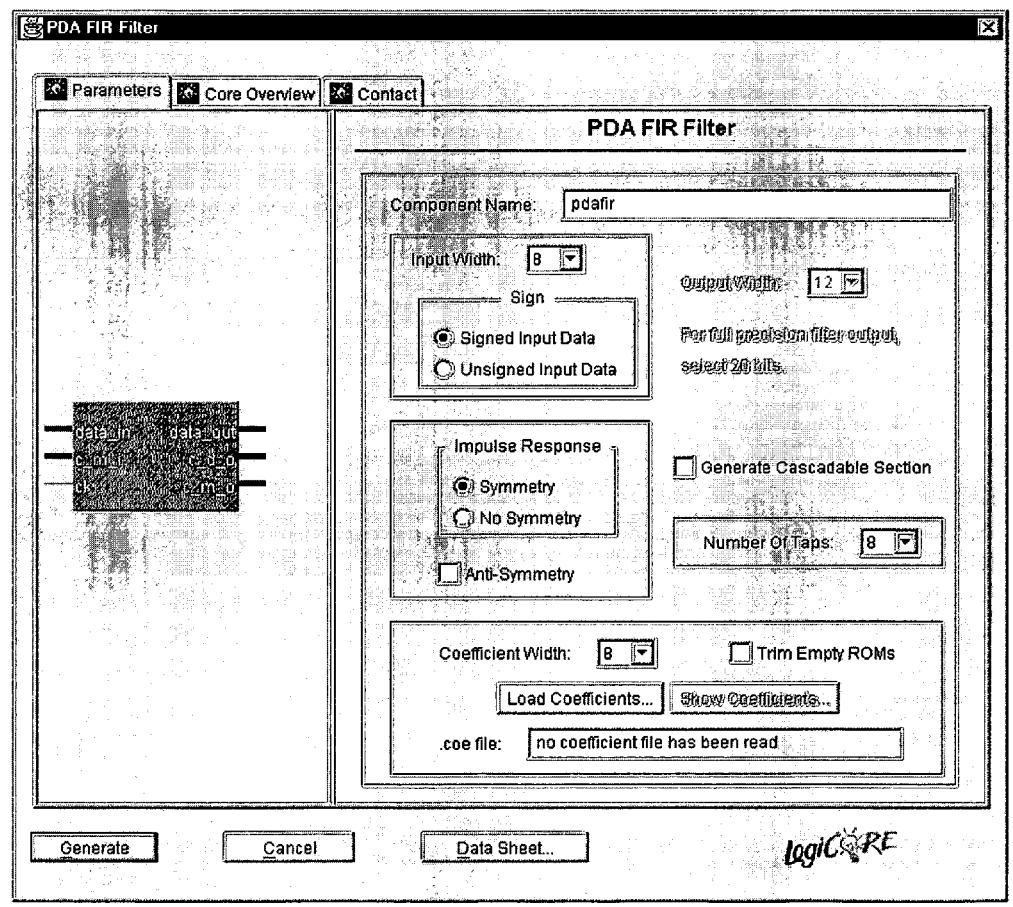

FIGS. 6A, 6B, and 6C show example GUI screens to which random parameters are input and then displayed. FIG. 6A is a data entry screen for a Synchronous FIFO core. The following parameters have been entered: "fifo" as the component name, −5 as the Port Width, 48 as the Depth, and Single Port RAM as the Internal Memory type. Because the Port Width range is 4–80, the specified −5 parameter is invalid. The invalid parameter is highlighted, and the dialog box of FIG. 6B indicates the bad value.

For the Filter screen of FIG. 6C, "pdafir" is the Component Name, 8 is the Input Width, Signed Input Data is selected, "Symmetry" is selected for Impulse Response, the Number of Taps is 8, and the Coefficient Width is 8. It will be appreciated that the Sign and Impulse Response parameters may be viewed as binary values for the purpose of generating random parameters.

Figure 7:
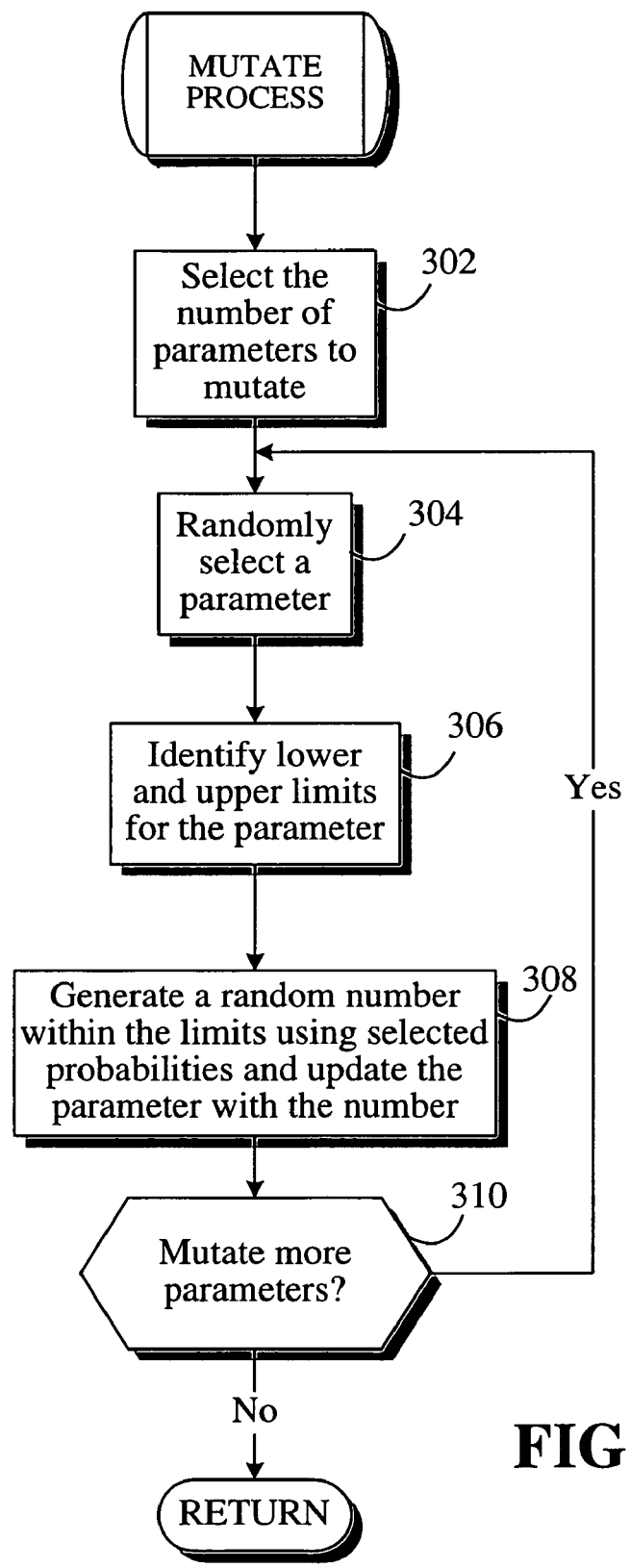
FIG. 7 is a flowchart of an example process for mutating parameters of a parameter set.

FIG. 7 is a flowchart of an example process for mutating parameters of a parameter set. At step 302, the number of parameters to mutate is selected. The number of parameters is selected based on the number of generations of parameter sets already generated and the time available for testing, for example. One parameter in the set is randomly selected at step 304, and the lower and upper limits are identified at step 306. Step 308 generates a random number within the identified limits and using selected probabilities, as explained above. The random number is then stored as the new parameter. While not shown, it will be appreciated that if the value is invalid for the parameter, the process of step 308 is repeated until a valid parameter is generated. Decision step 310 returns control to step 302 as long as there are more parameters to mutate. Otherwise, control is returned to step 120 of FIG. 1.

Accordingly, the present invention provides, among other aspects, a system and method for testing parameterized logic cores. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for testing a parameterizable logic core, comprising:
   randomly generating a set of parameter values for the logic core;
   generating a netlist from the set of parameter values and logic core;
   simulating circuit behavior with the netlist;
   cloning the set of parameter values;
   mutating the set of parameter values, whereby a mutated set of parameter values is produced;
   generating a new netlist from the mutated set of parameter values and logic core; and
   simulating circuit behavior with the new netlist.

2. The method of claim 1, further comprising for each parameter:
   generating a random parameter value within predetermined upper and lower limits associated with the parameter; and
   generating a new random parameter value if the random parameter value fails to meet predetermined criteria.

3. The method of claim 2, further comprising:
   assigning respective probabilities to one or more numbers between the upper and lower limits for one or more of the parameters; and
   generating the random parameter value as a function of the probabilities.

4. The method of claim 3, further comprising:
   providing the parameter value as input to a graphical user interface;
   generating random replacement values for invalid parameter values detected by the graphical user interface.

5. The method of claim 1, further comprising:
   providing the set of parameter values to a graphical user interface; and
   identifying invalid parameter values with the graphical user interface.

6. The method of claim 5, further comprising:
   generating random replacement parameter values for the invalid parameters; and
   repeating the steps of providing the replacement values to the graphical user interface, identifying invalid parameter values, and generating random replacements until all the parameter values are valid.

7. The method of claim 5, further comprising:
   selecting a random order in which to provide parameter values to the graphical user interface; and
   providing the parameters one-by-one as input to the graphical user interface.

8. The method of claim 1, wherein the set of parameter values is cloned and mutated only if an error is detected in simulating the circuit behavior.

9. The method of claim 8, further comprising repetitively cloning and mutating sets of parameters when errors are detected in simulating the circuit behavior, whereby multiple generations of sets of parameters are created.

10. The method of claim 9, wherein one or more of the parameter values in a parameter set are mutated.

11. The method of claim 10, wherein a number of parameter values mutated in a set of parameters is a function of a number of generations previously created.

12. The method of claim 1, further comprising:
    identifying which parameters of a graphical user interface are editable; and
    providing the set of parameter values to the graphical user interface.

13. The method of claim 12, further comprising:
    selecting a random order in which to provide the parameter values to the graphical user interface; and
    providing the values one-by-one as input to the graphical user interface.

14. The method of claim 1, further comprising:
    accumulating respective numbers of tests having been performed using different parameter values
    accumulating respective numbers of tests failed using each of the parameter values; and
    highlighting parameters having numbers of failed tests equal to the number of tests.

15. A system for testing a parameterizable logic core, comprising:
    a test controller configured and arranged to randomly generate a set of parameter values for the logic core;
    a core generator coupled to the test controller, the core generator configured and arranged to generate a netlist from the logic core and set of parameter values;
    a simulator coupled to the test controller, the simulator configured and arranged to simulating circuit behavior with the netlist and a predetermined test bench;
    wherein the test controller is further configured to clone the set of parameter values and mutate the set of parameter values, whereby a mutated set of parameter values is produced, the core generator is configured to generate a new netlist from the mutated set of parameter values and logic core, and the simulator is configured to simulate circuit behavior with the new netlist.

16. A system for testing a parameterizable logic core, comprising:
    a test controller including a GUI-driver, the GUI-driver configured and arranged to randomly generate a set of parameter values for the logic core;
    a core generator including a GUI coupled to the GUI-driver, the core generator configured and arranged to generate a netlist from the logic core and set of parameter values;
    a simulator coupled to the test controller, the simulator configured and arranged to simulating circuit behavior with the netlist and a predetermined test bench;
    wherein the GUI-driver is further configured to clone the set of parameter values and mutate the set of parameter values, whereby a mutated set of parameter values is produced, the core generator is configured to generate a new netlist from the mutated set of parameter values and logic core, and the simulator is configured to simulate circuit behavior with the new netlist.

17. An apparatus for testing a parameterizable logic core, comprising:
    means for randomly generating a set of parameter values for the logic core;
    means for generating a netlist from the set of parameter values and logic core; and
    means for simulating circuit behavior with the netlist;
    means for cloning the set of parameter values;
    means for mutating the set of parameter values, whereby a mutated set of parameter values is produced;
    means for generating a new netlist from the mutated set of parameter values and logic core; and
    means for simulating circuit behavior with the new netlist.

* * * * *